United States Patent [19]

Uno

[11] Patent Number: 5,710,457
[45] Date of Patent: Jan. 20, 1998

[54] SEMICONDUCTOR INTEGRATED CIRCUIT

[75] Inventor: Takayuki Uno, Tokyo, Japan

[73] Assignee: NEC Corporation, Tokyo, Japan

[21] Appl. No.: 541,102

[22] Filed: Oct. 11, 1995

[30] Foreign Application Priority Data

Oct. 28, 1994 [JP] Japan .................................. 6-265562

[51] Int. Cl.[6] .................................................. H01L 23/495
[52] U.S. Cl. .................................... 257/666; 257/676
[58] Field of Search .................................. 257/666, 676, 257/670, 672

[56] References Cited

U.S. PATENT DOCUMENTS 5,072,280  12/1991  Matsukura .............................. 257/676
5,294,827  3/1994   McShane ............................... 257/676

FOREIGN PATENT DOCUMENTS

60-64442  4/1985  Japan .
2-87641   3/1990  Japan .

*Primary Examiner*—Wael Fahmy
*Assistant Examiner*—Roy Potter
*Attorney, Agent, or Firm*—Whitham, Curtis, Whitham & McGinn

[57] ABSTRACT

A semiconductor integrated circuit is characterized in that a semiconductor chip and the distal end portions of inner leads are adhered and fixed using a coupling support member consisting of an insulating film with an insulating adhesive layer so as to expose the bonding pads of the chip and the bonding pads of the inner leads. In this structure, a conventional wire bonding technique can be applied, and contact between bonding wires and the chip can be prevented.

6 Claims, 6 Drawing Sheets

SEMICONDUCTOR INTEGRATED CIRCUIT

BACKGROUND OF THE INVENTION

1. Field of the Invention

The present invention relates to a plastic package type semiconductor integrated circuit in which a semiconductor chip, bonding wires, and inner leads are sealed by a thermosetting or thermoplastic resin and, more particularly, to a plastic package type semiconductor integrated circuit having a die-pad-less structure which is manufactured using a lead frame having no die pad for die-bonding a chip.

2. Description of the Prior Art

Figure 1A:
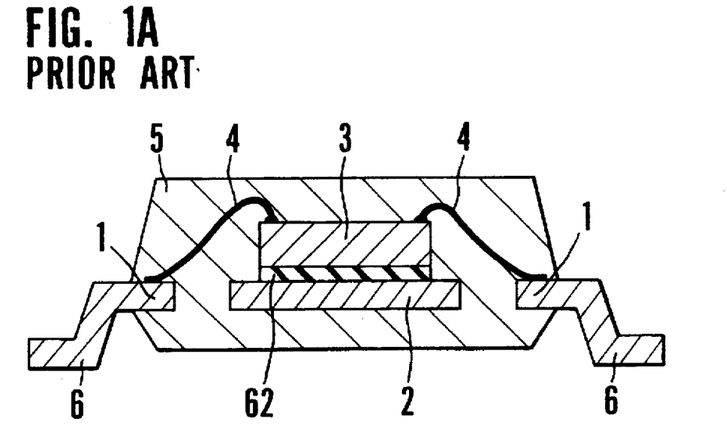
FIGS. 1A and 1B are sectional views each showing one example of a conventional resin sealing type LSI with a die pad.

A conventional plastic package type semiconductor integrated circuit (to be referred to as a resin sealing type LSI hereinafter) has a structure in which a chip 3 is fixed to a die pad 2 (to be referred to as "with a die pad" hereinafter), as shown in FIG. 1A. The resin sealing type LSI with the die pad shown FIG. 1A is manufactured as follows. First of all, the semiconductor chip 3 is fixed to the die pad 2 of a metal lead frame through a brazing material 62 such as a silver paste. The lead frame is formed of a thin plate consisting of an iron-nickel alloy, a copper alloy, or the like. Inner leads 1, the die pad 2, outer leads 6, and the like are patterned by an etching or stamping method. Then, the chip 3 is electrically connected to the inner leads 1 through thin wires (bonding wires) 4 consisting of, e.g., gold. The main portions are sealed by a molding resin 5 such as an epoxy, and the outer leads 6 of the lead frame are soldered and plated. Finally, the outer leads 6 are formed into a predetermined shape, completing the resin sealing type LSI.

Figure 2:
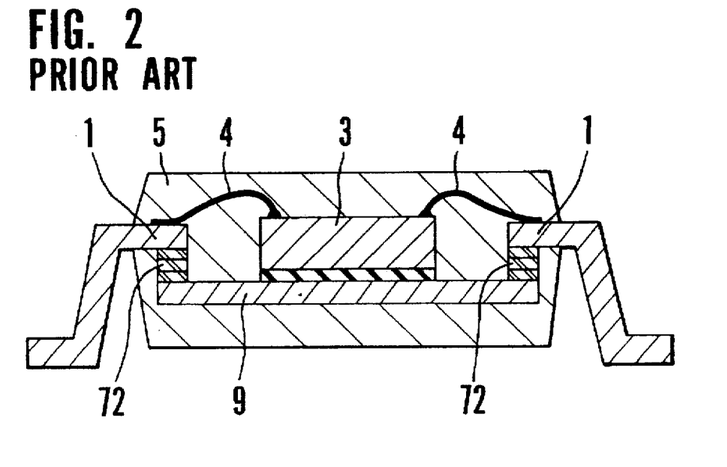
FIG. 2 is a sectional view showing one example of a conventional resin sealing type LSI with a heat spreader.

As is apparent from the above description, a support member for supporting and fixing a chip must be required in manufacturing a resin sealing type LSI. In the LSI with the die pad shown in FIG. 1A, the die pad 2 of the lead frame can be regarded as the support member. Although some resin sealing type LSIs have a structure using no die pad, such an LSI always comprises a member for supporting a chip instead of a die pad. For example, an LSI having relatively large power may have a metal heat spreader for heat dissipation in order to improve heat dissipation. FIG. 2 is a sectional view showing the structure of a resin sealing type LSI using such a heat spreader. Referring to FIG. 2, in this LSI with a heat spreader, a heat spreader 9 is fixed to inner leads 1 through a double-coated film 72, and a chip 3 is fixed to the heat spreader 9. In the LSI having this structure, it can be considered that the heat spreader 9 has a function of dissipating heat upon completion of the LSI and serves as a chip support member during a manufacturing process.

In short, the conventional resin sealing type LSI has a metal chip support member (die pad or heat spreader).

In recent years, however, with the development of highly functional, high-density LSIs, an increase in the number of pins is demanded. Under such conditions, as for a chip, with advances in micropatterned wiring techniques and multi-layered wiring techniques, an increase in the number of pins can be realized without excessively increasing the chip size. However, as for assembly techniques for the above-described conventional resin sealing type LSIs such as a resin sealing type LSI with a die pad and a resin sealing type LSI with a heat spreader as described above, the following problems are posed due to two causes: ① the above-described tendency to an increase in the number of pins; and ② a metal chip support member.

First, with the tendency to an increase in the number of pins, a bonding wire is elongated. To manufacture a lead frame, manufacturing methods such as a wet etching method and a stamping method have been employed in consideration of the manufacturing cost. However, micropatterning by such a manufacturing technique almost has limits. For example, the pitch of the distal end of an inner lead in an existing lead frame is about 0.20 mm when a 42-alloy plate of 0.15 mmt is used, and about 0.18 mm when a 42-alloy plate of 0.125 mmt is used, which are processing limitations in consideration of mass production. That is, to increase the number of pins of a lead frame, a side along which inner leads are arranged must be elongated. In contrast to this, the number of pins of a chip is increased in an almost conventional size, as described above. For this reason, in the resin sealing type LSIs each using a metal lead frame, and especially QFPs (Quad Flat Packages) each having a large number of (e.g., 160 or more) pins, a chip cannot be close to inner leads due to the processing limitation of a lead frame, i.e., a bonding wire is undesirably elongated. In the conventional structure, the general bonding wire length is set to about 1 to 4 mm in accordance with conditions such as wire properties, the mechanism of a bonding unit, and the sealing properties of a molding resin. In recent years, however, the wire length is increased to 5 mm or more under the above circumstances.

Figure 1B:
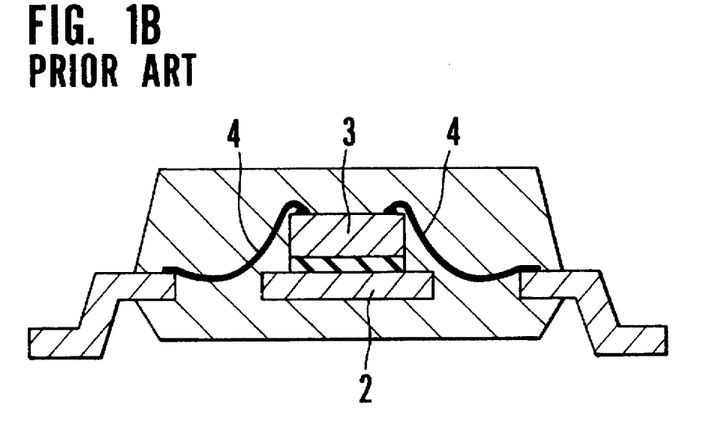

If bonding wires are elongated, bonding wires 4 are easily suspended, as shown in FIG. 1B. When the bonding wires 4 are excessively suspended, the problem of so-called edge touch may be posed in which the suspended portions of the wires 4 contact the chip 3 and the edges of the die pad 2 to cause leakage or a short defect. Even if edge touch does not occur due to suspension of the wires, a molding defect easily occurs when the wires 4 are shifted and deformed by the injection pressure of a resin in a molding resin sealing step after bonding to cause a short defect.

Next, the presence of a metal die pad increases the internal stress of a package. Especially in an LSI of a thin package having a package thickness of about 1.0 to 1.4 mm, the ratio of a die pad to the package cannot be ignored, and package cracking easily occurs during a reliability test such as a temperature cycle test. Further, due to the presence of a die pad, the inner lead length must be adjusted to the size of the die pad, so many types of patterns must be prepared for lead frames. As a result, the design manhour and the materials handling manhour are increased, and a reduction in cost becomes difficult.

In the resin sealing type LSI with the heat spreader (FIG. 2), optimum materials cannot be used for a lead frame and the heat spreader, respectively. For example, an iron-nickel alloy-based metal is suitable for the lead frame in the view of strength and processability. On the other hand, a copper alloy-based material is suitable for the heat spreader in the view of the thermal conductivity. The iron-nickel alloy-based material has a thermal expansion coefficient of 6 to $7 \times 10^{-6}/°C$., and the copper alloy-based material has a thermal conductivity of 17 to $18 \times 10^{-6}/°C$., which is three times higher than the former thermal conductivity. In the LSI shown in FIG. 2, since the two metals, which have such a thermal expansion coefficient difference, are directly adhered and fixed, the lead frame undesirably warps.

More specifically, resin sealing type LSIs each using a metal chip support member such as the LSI with a die pad and the LSI with a heat spreader have the following problems:

① edge touch with elongation of a bonding wire caused by an increase in the number of pins;

② increases in the types of lead frame patterns and the internal stress of a package due to a die pad (in the case of the LSI with the die pad); and ③ warping of a lead frame due to a heat spreader (in the case of the LSI with the heat spreader).

Figure 3A:
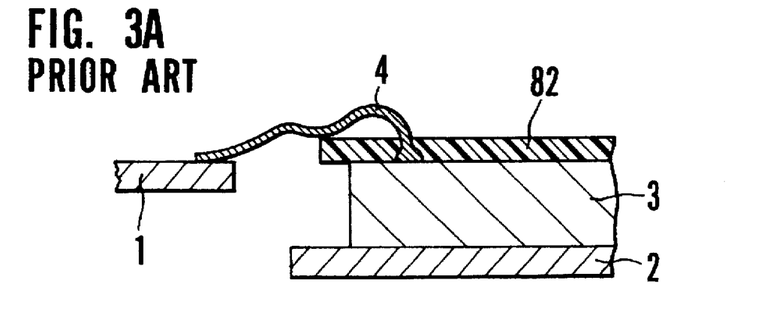
FIGS. 3A to 3C are sectional views showing another example and modifications of the conventional resin sealing type LSI with the die pad, respectively.
Figure 3B:
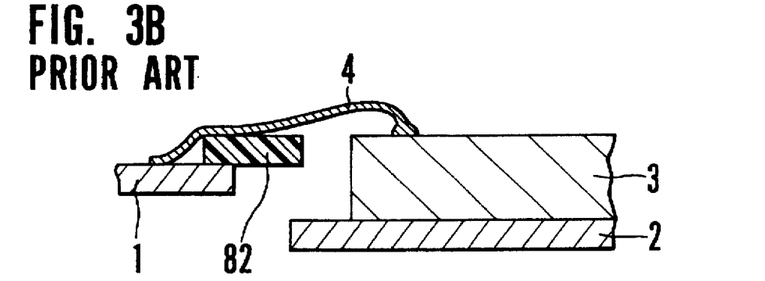
Figure 3C:
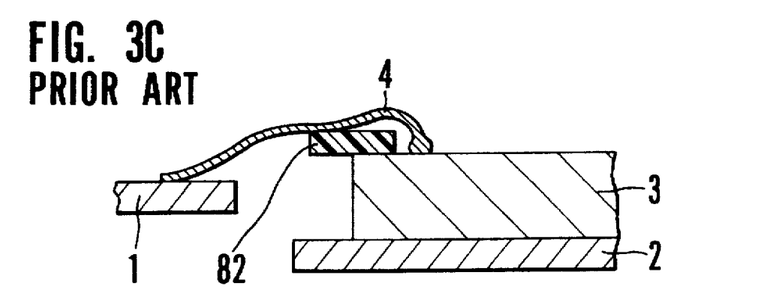

Of the above-described problems, as for edge touch between bonding wires and a chip, Japanese Unexamined Patent Publication No. 60-64442 discloses one of techniques of preventing the edge touch. In three resin sealing type LSIs respectively shown in FIGS. 3A to 3C, an insulating film 82 is adhered to the surface of a chip 3 so as not to bring a bonding wire 4 into contact with the chip 3 and cause short-circuiting (in each case of FIGS. 3A and 3C), or the insulating film 82 is adhered to the distal end portion of an inner lead 1 of a lead frame (in the case of FIG. 3B). In any case, the insulating film 82 overhangs from the chip 3 side to the inner lead 1 side or from the inner lead 1 side to the chip 3 side. With this structure, even if the wire 4 is suspended, the wire 4 does not contact the chip 3 because the insulating film 82 is interposed between the suspended portion and the chip 3. That is, the problem of edge touch with elongation of the bonding wire 4 can be solved. However, the basic structure of the LSI having such a structure is the same as the structures of the conventional LSI with the die pad or with the heat spreader shown in FIG. 1A or 2, as a whole. Therefore, the problems of an increase in cost, an increase in internal stress, and warping of a lead frame are left unsolved.

Figure 4:
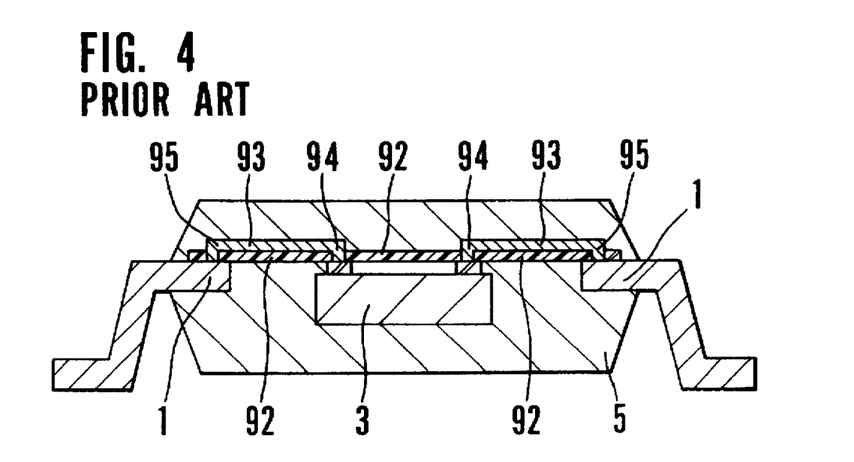
FIG. 4 is a sectional view showing one example of a conventional resin sealing type LSI having a die-pad-less structure.

On the other hand, Japanese Unexamined Patent Publication No. 2-87641 discloses a resin sealing type LSI having another structure for preventing edge touch of a bonding wire. FIG. 4 shows a sectional structure of the resin sealing type LSI disclosed in this publication. Referring to FIG. 4, in this LSI, an insulating film 92 is used instead of the die pad and the heat spreader shown in FIGS. 1A to 3C, and a metal wiring layer 93 formed on the insulating film 92 is used instead of a bonding wire. That is, a conductive pattern is formed on the metal wiring layer 93 of the insulating film 92 so as to match inner leads 1 and a chip 3. Electrode patterns 94 and 95 extending through the insulating film 92 are arranged at the two corresponding ends of the conductive pattern. The electrode pattern 94 is aligned with the chip 3, while the electrode pattern 95 is aligned with the inner leads 1. All connected portions are bonded at once (such a structure having no die pad is referred to as "a die-pad-less structure" hereinafter). In this die-pad-less structure, edge touch caused by suspension of a bonding wire does not occur, as a matter of course. In addition, since the chip is supported only by the insulating film during a manufacturing process, the problems caused by using a metal die pad or a heat spreader, i.e., an increase in cost, an increase in internal stress, and warping of a lead frame can hardly be generated.

As described above, in the resin sealing type LSI having the die-pad-less structure (FIG. 4) disclosed in Japanese Unexamined Patent Publication No. 2-87641, edge touch with elongation of a bonding wire can be effectively prevented. In the LSI having this structure, however, the insulating film 92 is very expensive because the dimensional accuracy of the metal wiring layer 93 is strict, and the electrode patterns 94 and 95 are required to complicate the structure. For this reason, it is difficult to reduce the cost of the LSI. Further, an exclusive bonding unit is required to connect the chip or the inner leads. That is, conventional assembly techniques are less suitable for this structure, and a large amount of investment is newly required. Still further, the conductive pattern of the metal wiring layer 93 largely depends on a pad arrangement on the chip or the arrangement and shape of the inner leads of the lead frame. That is, an exclusive metal wiring pattern must be prepared for each type of an LSI, resulting in increases in the pattern design manhour and materials handling manhour.

SUMMARY OF THE INVENTION

The present invention, therefore, has been made in consideration of the above situation, and has as its object to provide a resin sealing type LSI having an economical advantage and high reliability represented by a resin sealing type LSI having a die-pad-less structure in which no metal die pad or heat spreader is used for supporting a chip during a manufacturing process.

It is another object of the present invention to perform wire bonding in a resin sealing type LSI having a die-pad-less structure to allow use of a conventional bonding unit for this LSI, and manufacture this LSI at low cost without using an expensive insulating film with a metal wiring layer.

It is still another object of the present invention to provide a resin sealing type LSI having a die-pad-less structure capable of wire bonding which is free from occurrence of edge touch between a bonding wire and a semiconductor chip, and can cope with elongation of the bonding wire with an advanced function and a high density.

It is still another object of the present invention to increase the degree of freedom in material selection, and improve the electrical characteristics and reliability of an LSI.

To achieve the above objects, according to the main aspect of the present invention, there is provided a semiconductor integrated circuit of a plastic package type, including a semiconductor chip having a bonding pad on one major surface, an outer lead electrically connected to the outside, an inner lead electrically connected to the outer lead, a bonding wire for electrically connecting the bonding pad to the inner lead, and a sealing resin for covering and sealing the semiconductor chip, the bonding wire, and the inner lead, comprising: a coupling support member formed of any one of a film-like member and a thin-plate-like member each having at least one insulated surface and an insulating adhesive layer on the other surface, and constituted by a chip fixing portion for adhering and fixing the semiconductor chip so as to expose the bonding pad, a contact preventing portion located in a space between the semiconductor chip, the inner lead, and the bonding wire, a lead fixing portion for adhering and fixing the inner lead so as to expose a bonding portion, and a coupling portion for coupling the chip fixing portion, the contact preventing portion, and the lead fixing portion, wherein the semiconductor chip and the inner lead are adhered and fixed to the adhesive layer of the coupling support member to be coupled to each other through the coupling portion, thereby realizing a die-pad-less structure.

According to the present invention, in an assembly step, a semiconductor chip is supported by coupling the inner leads of a lead frame to the chip through an insulating film or thin plate. An internal stress caused by using a metal die pad is not generated because the die pad and a heat spreader are not used for supporting the chip. In addition, many types of lead frames need not be prepared for the shapes of die pads, i.e., the shapes of chips for the respective types of LSIs.

According to the present invention, the insulating adhesive layer is arranged on the surface of the insulating film (or thin plate) for coupling the chip to the inner leads. During a manufacturing process, the chip is easily coupled to the inner leads and supported only by adhering and fixing the inner leads and the chip to the adhesive layer. After the chip and the inner leads are coupled to each other and fixed, the bonding pad portions of the chip and the bonding portions of the inner leads are connected by a conventional wiring bonding technique. That is, an exclusive bonding unit is not required for connecting the chip to the inner leads. According to the present invention, the insulating film is arranged between the chip, the inner leads, and the bonding pads. Therefore, even if bonding wires are elongated, the wires do not contact the chip due to suspension of the wires.

If a heat spreader is required for the LSI of the present invention, the heat spreader can be directly fixed to the lower surface of the chip. A metal material having a high thermal conductivity can be freely selected as the material of the heat spreader regardless of the thermal expansion coefficients of the materials of the heat spreader and the inner lead because the inner leads are not directly fixed to the heat spreader, unlike in the conventional resin sealing type LSI having a structure in which a heat spreader is connected and fixed to inner leads and used for supporting a chip during a manufacturing process and for heat dissipation after completing the LSI. On the other hand, a metal having a high strength and excellent processability can be used for a lead frame.

The above and other advantages, features and additional objects of the present invention will become manifest to those versed in the art upon making reference to the following detailed description and accompanying drawings in which preferred structural embodiments incorporating the principle of the present invention are shown by way of illustrative example.

DETAILED DESCRIPTION OF PREFERRED EMBODIMENTS

Figure 5A:
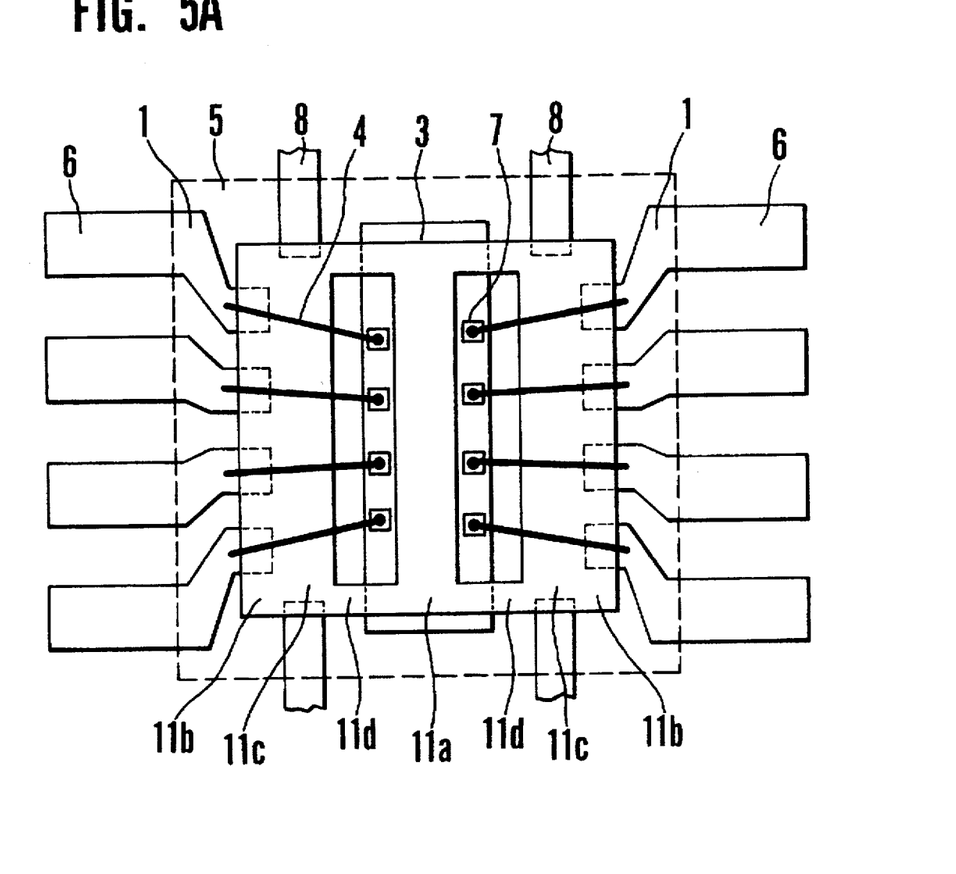
FIGS. 5A and 5B are a plan view and a sectional view, respectively, showing a resin sealing type LSI according to the first embodiment of the present invention.
Figure 5B:
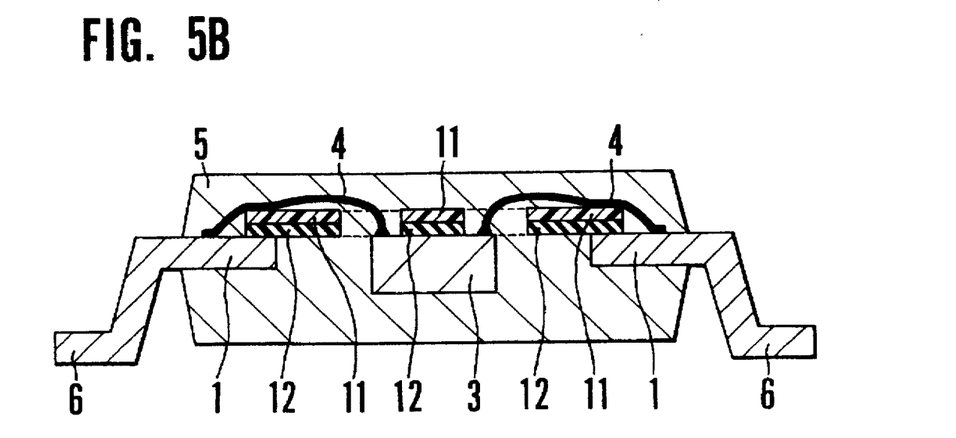

Several preferred embodiments of the present invention will be described below with reference to the accompanying drawings. FIGS. 5A and 5B are a plan view and a sectional view each showing a resin sealing type LSI according to the first embodiment of the present invention. In the first embodiment, a chip 3 and inner leads 1 of a lead frame are fixed to one surface of an insulating film 11. The insulating film 11 is constituted by four portions, i.e., a chip fixing portion 11a at which slits are formed near bonding pads 7 to fix the chip, lead fixing portions 11b for fixing the distal end portions of the inner leads, contact preventing portions 11c for preventing edge touch of bonding wires, and coupling portions 11d for coupling the chip fixing portion 11a, the lead fixing portions 11b, and the contact preventing portions 11c. In the first embodiment, the lead fixing portions 11b are integrally formed with the contact preventing portions 11c. An insulating adhesive layer 12 is formed on this insulating film 11 on the fixing surface side of the chip 3 and the inner leads 1 in advance. The chip 3 and the inner leads 1 are adhered and fixed to the adhesive layer 12 of the film 11 so as to expose the bonding pads of the chip 3 and the bonding portions of the inner leads 1. Although the order of bonding is not especially limited, it is convenient to adhere the inner lead 1 side first, because this order is similar to the manufacturing flow of a conventional LSI. In addition, this order is more convenient because the inner leads 1 can be prevented from being deformed. It is desirable for performing accurate registration in bonding to form an alignment pattern or notched portions on the surface of the film 11 or chip 3, or the lead frame in advance.

Preferable examples of the material of the film are polyimide-based films such as Kapton (available from DuPont, U.S.A.) and Upilex (available from Ube Industries, Ltd.), a glass-epoxy board, and the like. The film material, however, is not especially limited to them. Since the glass-epoxy board has a thermal expansion coefficient and an elasticity modulus almost equal to those of a molding resin 5 compared to the material of a lead frame, the internal stress of a package is sufficiently released compared to a case using a metal lead frame. Further, a metal thin plate may be used as far as its surface is insulated. In this case, according to the first embodiment, since a lead frame having a thickness much smaller than that of a conventional lead frame can be used, the internal stress can be sufficiently released even if the material of the film is identical to that of the conventional lead frame. Still further, if the metal surface is insulated by being covered with a metal oxide film or thin resin film layer, the adhesion properties of the lead frame with the sealing molding resin 5 are greatly improved to hardly cause peeling. For this reason, resin cracking can hardly occur even if the material and thickness of the film are identical and equal to those of the conventional lead frame.

Preferable examples of the material of the insulating adhesive layer 12 are B-stage thermosetting resins in which hardening is interrupted such as an epoxy, polybutadien, and a phenolic resin. The film material, however, is not especially limited to them. The insulating adhesive layer 12 may be coated with a thermoplastic resin such as polyimide.

In the first embodiment, the chip 3 is aligned with the film 11 provisionally fixed to a proper position with respect to the inner leads 1 in advance. Thereafter, the obtained structure is heated and pressed to fix the chip 3 to the film 11. Subsequently, as in the conventional resin sealing type LSI shown in FIG. 1A, the bonding pads 7 are bonded to the inner leads 1 by wires 4, and then the resultant structure is sealed by the molding resin 5 to complete the resin sealing type LSI of this embodiment.

In the first embodiment, even if bonding is performed with elongated bonding wires 4, and the wires 4 are suspended, no edge touch occurs between the wires 4 and the chip 3 due to the presence of the contact preventing portions 11c of the film 11. Further, the internal stress of the package is greatly reduced because of the absence of a die pad.

Although a support hanging lead is not required because of the absence of a die pad, it is preferable to leave hanging leads 8 for supporting a package in consideration of management during a manufacturing process. The distal end portions of the hanging leads 8 may be adhered and fixed to the film 11 so as to prevent the hanging leads 8 from being deformed, similar to the inner leads 1.

Figure 6A:
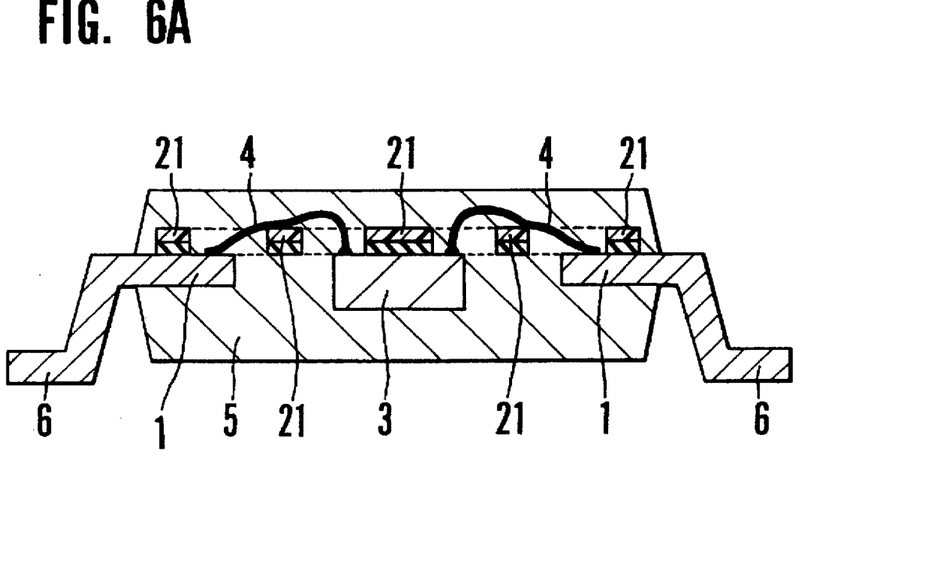
FIGS. 6A and 6B are a sectional view showing a resin sealing type LSI according to the second embodiment of the present invention, and a plan view showing an insulating film used in the second embodiment.
Figure 6B:
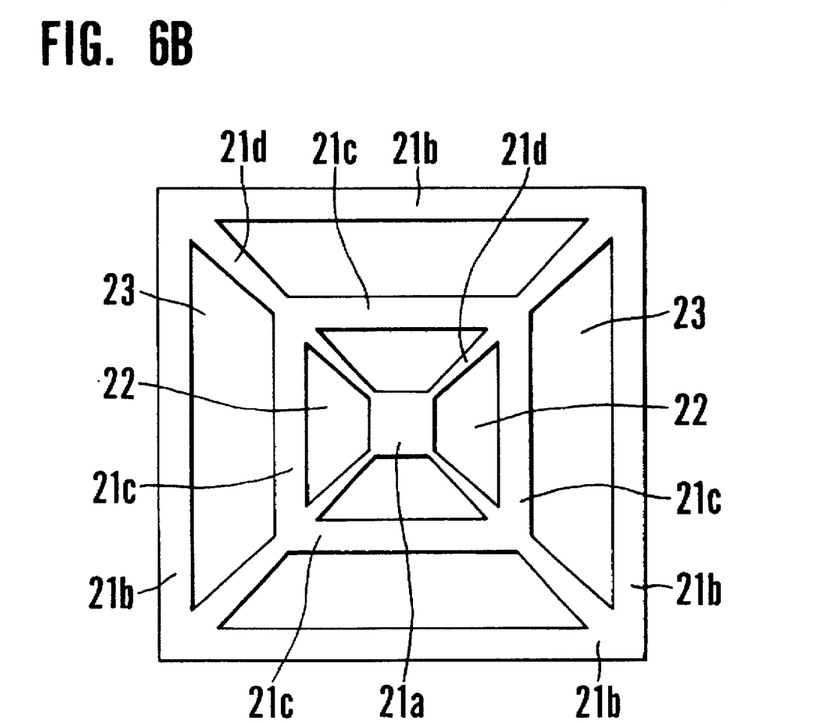

As has been described above, the first embodiment has exemplified the case using the insulating film on which the chip fixing portion is integrally formed with the contact preventing portions. Next, the second embodiment having a structure in which a lead fixing portion is separated from a contact preventing portion will be described. FIGS. 6A and 6B are a sectional view showing a resin sealing type LSI according to the second embodiment of the present invention, and a plan view showing an insulating film used in the second embodiment, respectively. According to the second embodiment with reference to FIGS. 6A and 6B, opening portions 22 are formed in an insulating film 21 near bonding pad portions, and opening portions 23 are formed near the bonding portions of inner leads 1. That is, a rectangular chip fixing portion 21a is surrounded by a frame-like contact preventing portion 21c, and the contact preventing portion 21c is surrounded by a frame-like lead fixing portion 21b. By four coupling portions 21d radially extending from the four corners of the chip fixing portion 21a, the chip fixing portion 21a is coupled to the contact preventing portion 21c, and the contact preventing portion 21c is coupled to the lead fixing portion 21b. With the insulating film 21 having such a shape, the contact area between a molding resin 5 above a package and that under the package becomes larger than the contact area in the first embodiment. In the first embodiment, if the bonding wire length is increased over, e.g., 5 mm, the integrated portions between the lead fixing portions 11b and the contact preventing portions 11c are increased in size. As a result, the area of the molding resin 5 to be horizontally divided is increased to decrease the package strength. According to the second embodiment, such a decrease in package strength caused by elongation of a bonding wire can be prevented.

Figure 7A:
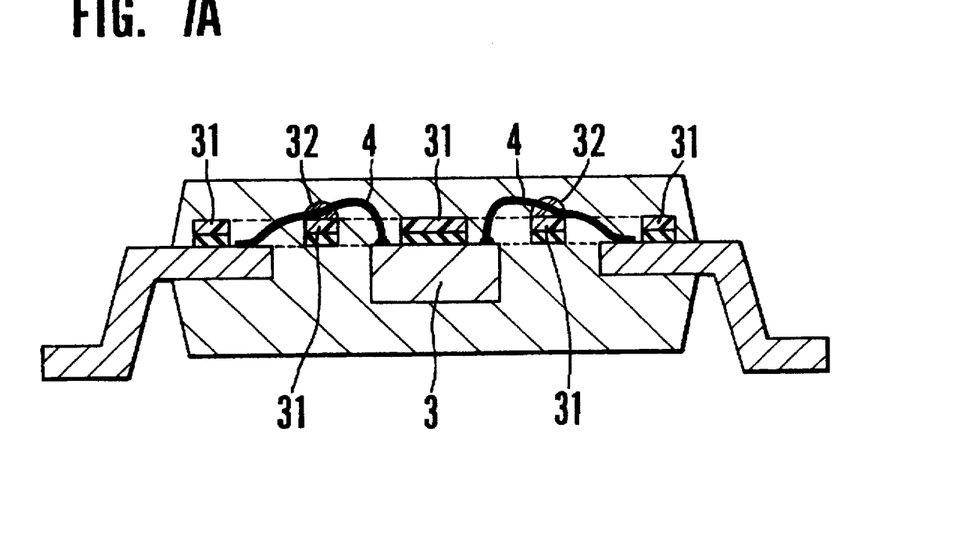
FIGS. 7A and 7B are a sectional view showing a resin sealing type LSI according to the third embodiment of the present invention, and a plan view showing an insulating film used in the third embodiment.
Figure 7B:
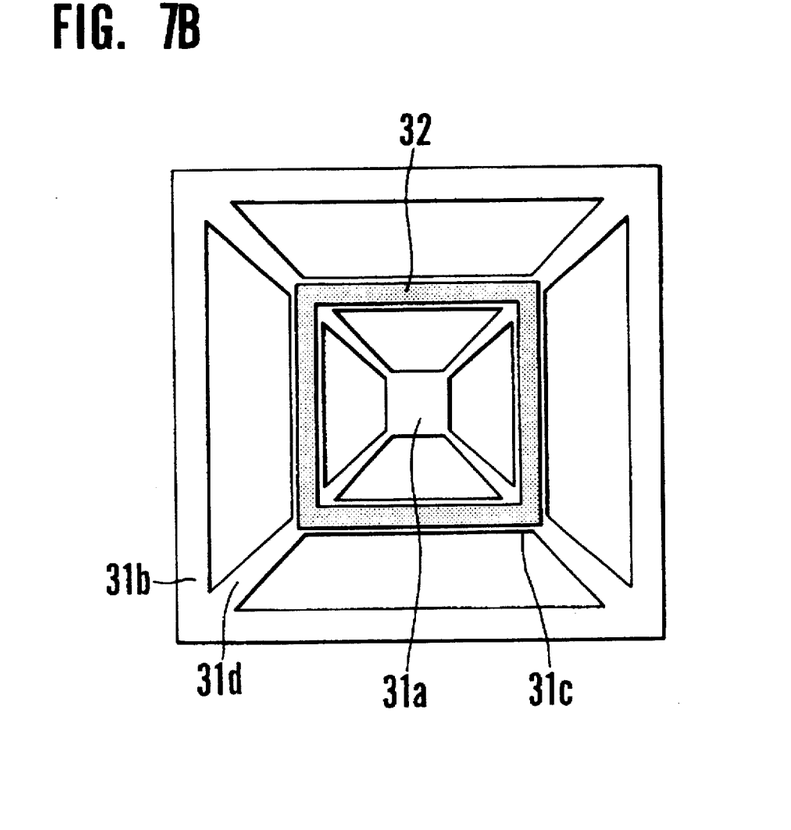

The third embodiment having a structure in which an insulating film for preventing edge touch has the same shape as in the second embodiment, and bonding wires are fixed using a frame-like contact preventing portion will be described below. FIGS. 7A and 7B are a sectional view showing a resin sealing type LSI according to the third embodiment of the present invention, and a plan view showing an insulating film with an adhesive layer used in the third embodiment, respectively. Referring to FIGS. 7A and 7B, the planar shape of a film 31 used in this embodiment is the same as that of the film 21 in the second embodiment (FIG. 6B). Note that, in the third embodiment, an adhesive layer 32 for fixing bonding wires is formed on the upper surface (i.e., a surface opposite to a surface to which a chip 3 and inner leads 1 are fixed) of a frame-like contact preventing portion 31c. Bonding wires 4 are fixed to this adhesive layer 32 before a resin sealing step. Therefore, shifts in the bonding wires, which are caused by injecting a molding resin in the resin sealing step, can be completely prevented.

A preferable example of the material of the wire fixing adhesive layer 32 is a polyimide-based resin having a glass transition temperature of 50° to 200° C. and a bonding temperature of about 200° to 300° C. in the case of a thermoplastic resin. The material, however, is not limited to this. It is preferable to apply such a resin to the film 31 to a thickness of about 10 to 50 μm in advance. Preferable examples of the material of the adhesive layer 32 may be an ultraviolet-curing resin and a thermosetting resin. In this case, a resin may be dropped onto only the frame-like contact preventing portion 31c by a dispensation method after bonding and hardening under proper conditions. Taking the workability into consideration, an ultraviolet-curing epoxy resin and a silicone resin are easy-to-use, but the material is not especially limited to them.

Table 1 shows the results obtained when the structure of the third embodiment and the conventional structure shown in FIG. 1A were applied to 28×28 mm² 208-pin QFPs, respectively. According to of the third embodiment with reference to Table 1, the bonding wire length, which was 5 mm at most in the conventional structure, could be increased to 7 mm. In addition, the assembly percentage of non-defectives with the maximum wire length (i.e., 5 mm in the conventional structure, and 7 mm in the third embodiment) could be increased from conventional percentage of non-defectives of 80% to 95% or more. On the other hand, from the results of a reliability test (temperature cycle test) which was conducted to examine the effect of decreasing the internal stress of a package, the service life was increased from 300 cycles (conventional) to 1,000 cycles or more, which is three times longer than the conventional service life. It was confirmed that the internal stress was certainly decreased. In addition, the number of design patterns for lead frames, which was 10 patterns in the conventional structure, was only 3 patterns in the third embodiment. Therefore, according to the third embodiment, the lead frame design manhour and the materials handling manhour can be decreased.

TABLE 1

Figure 8A:
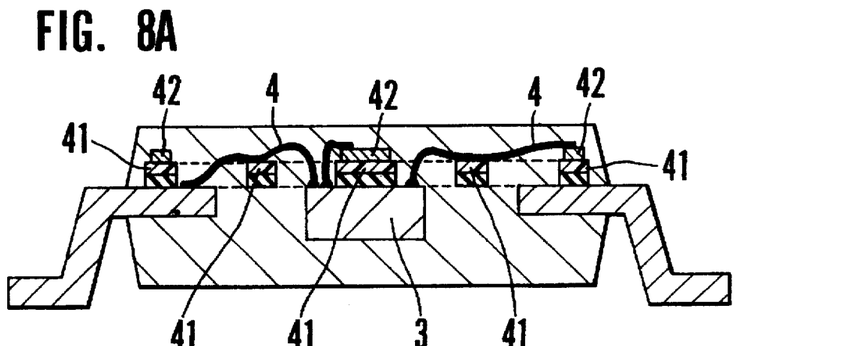
FIGS. 8A and 8B are a sectional view showing a resin sealing type LSI according to the fourth embodiment of the present invention, and a plan view showing an insulating film used in the fourth embodiment.
Figure 8B:
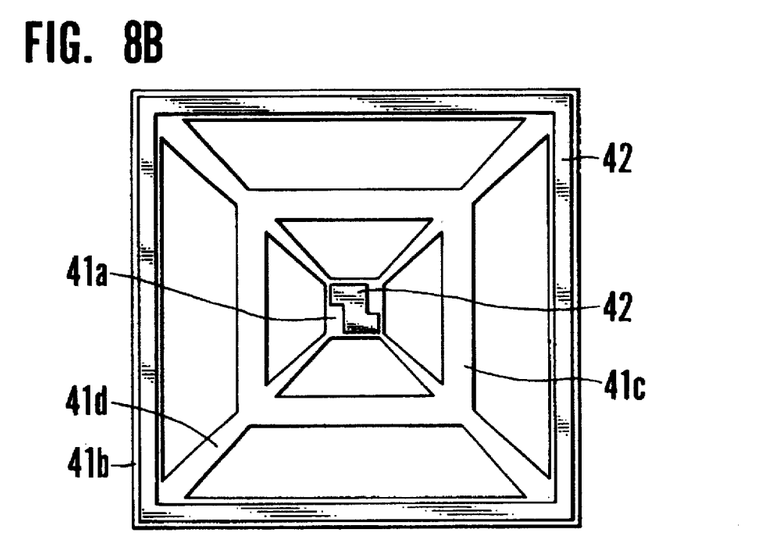

| Effect[1] | Item | Present Invention[2] | Conventional Example[3] |
|---|---|---|---|
| Compatibility with Elongation of Bonding Wire | Maximum wire length | 7 mm | 5 mm |
| | Assembly percentage of non-defectives[4] | 95% or more | 80% or less |
| Decrease in Internal Stress of Package | Temperature resistance cycle property | 1,000 cycles or more | 300 cycles |
| Decrease in Lead Frame Design/Handling Manhour | Number of design patterns | 3 patterns | 10 patterns | note:
[1]service package: 28 × 28-mm² 208-pin QFP
[2]third embodiment
[3]reference to FIG. 6value with the maximum wire length Next, the fourth embodiment having a structure in which a film having the same shape as that of the insulating film with the adhesive layer in the second embodiment is used, and a power supply wiring layer and a ground wiring layer for an LSI are strengthened using a frame-like lead fixing portion will be described. FIGS. 8A and 8B are a sectional view showing a resin sealing type LSI according to the fourth embodiment of the present invention, and a plan view showing an insulating film with an adhesive layer used in the fourth embodiment, respectively. In the fourth embodiment, metal wiring layers 42 are formed on a chip fixing portion 41a of an insulating film 41 and the upper surface (i.e., a surface opposite to a surface to which a chip 3 and inner leads 1 are fixed) of a lead fixing portion 41b by an etching method in advance. Each metal wiring layer 42 is sufficiently wider and thicker than those of a metal wiring layer in the chip 3. Therefore, if these metal wiring layers 42 are used as a power supply wiring layer and a ground wiring layer, the wiring resistance is remarkably decreased to stabilize the operation of the LSI, improving the characteristics and increasing the percentage of non-defectives. The dimensional accuracy of the metal wiring layer 42 in the fourth embodiment is more moderate than that of the metal wiring layer 93 in the conventional LSI having the die-pad-less structure (FIG. 4). In addition, the electrode patterns 94 and 95 for connecting a chip to inner leads are not required. Therefore, an increase in cost with the metal wiring layers 42 to the insulating film 41 is small.

Figure 9:
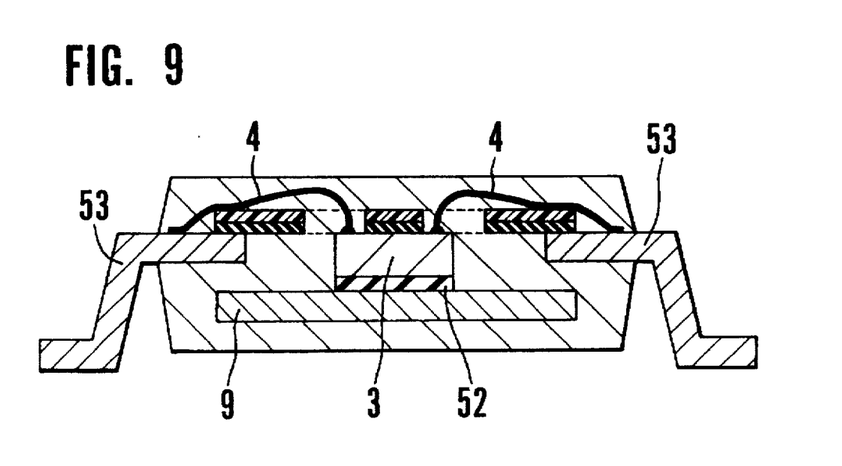
FIG. 9 is a sectional view showing a resin sealing type LSI according to the fifth embodiment of the present invention.

All the first to fourth embodiments are related to the resin sealing type LSIs without using a heat spreader. Next, the fifth embodiment in which the present invention is applied to an LSI with a heat spreader will be described. FIG. 9 is a sectional view showing a resin sealing type LSI according to the fifth embodiment of the present invention. According to the fifth embodiment with reference to FIG. 9, a heat spreader 9 is fixed to the lower surface (i.e., a surface opposite to a surface on which bonding pads are arranged and which is to be adhered to an insulating film) of a chip 3 through a brazing material 52 such as a silver paste. In this structure, different materials can be used for a lead frame 53 and the heat spreader 9, respectively. For example, an iron-nickel-based alloy is suitable for the lead frame 53 in the view of strength and processability. On the other hand, a copper alloy having a high thermal conductivity is suitable for the heat spreader 9. However, as has been described above, the thermal expansion coefficient of the copper alloy is three times higher than that of the iron-nickel-based alloy. In the conventional LSI with the heat spreader (FIG. 2), since the metals, which have a large difference between the thermal expansion coefficients, are directly adhered and fixed to each other, the lead frame warps. To the contrary, in the fifth embodiment, since the lead frame 53 is separated from the heat spreader 9, materials respectively optimum for them can be used without any problem.

As has been described above, according to the present invention, the inner leads of the lead frame are coupled to the semiconductor chip through the insulating film or thin plate to realize a die-pad-less structure. According to the present invention, therefore, there is provided the resin sealing type LSI having high reliability at low cost as an LSI having a die-pad-less structure.

In the present invention, the insulating adhesive layer is arranged on the surface of the insulating film for coupling the chip to the inner leads. With this arrangement, the chip is easily coupled to the inner leads and supported only by independently adhering the inner leads and the chip to the adhesive layer. After the chip and the inner leads are coupled to each other and fixed, they are connected by a conventional wiring bonding technique. Therefore, according to the present invention, no exclusive bonding unit is required for performing bonding, so no additional investment is required. Further, since an expensive insulating film with a metal wiring layer used in the conventional LSI having the die-pad-less structure is not required, the cost can be reduced. Still further, unlike the conventional LSI having the die-pad-less structure, the chip shape can hardly depend on the arrangement of bonding pads, the arrangement of inner leads, and the like, and an expensive insulating film with a metal wiring layer need not be prepared for each type of LSI, thereby decreasing the design manhour and the handling manhour.

In the present invention, the insulating film is arranged between the chip, the inner leads, and the bonding pads. Even if bonding wires are elongated, the wires do not contact the chip due to suspension of the wires. Therefore, the present invention can cope with elongation of bonding wires with development of highly functional, high-density LSIs.

If a heat spreader is required for the LSI of the present invention, the heat spreader can be directly fixed to the lower surface of the chip. Since the inner leads are not directly fixed to the heat spreader, a metal material having a high thermal conductivity can be freely selected as the material of the heat spreader regardless of the thermal expansion coefficients of the materials of the heat spreader and the inner lead.

According to the present invention, in highly functional, high-density LSIs, elongation of bonding wires can be coped with, the reliability and electrical characteristics can be improved, the cost can be reduced, and the degree of freedom of material selection in structural designs can be increased. The present invention has great industrial effects.

What we claimed is:

1. An integrated circuit (IC) package, for packaging an IC chip with a plurality of bonding pads on one major surface, said IC package comprising:
   a plurality of leads each said lead having an outer portion and an inner portion;
   a plurality of bonding wires, each of said bonding wires electrically connecting a contacting area of one of said leads to a corresponding said bonding pad on said IC chip packaged in said IC package;
   a sheet-like coupling support member having an insulated side and an insulating adhesive side, said sheet-like coupling support member further comprising:
   a chip fixing portion on said insulating adhesive side, said IC chip being fixedly adhered to chip faring portion on said major surface, and
   a lead fixing portion for fixedly adhering a distal end of each of said plurality of leads, each said lead contact area being separated from said chip fixing portion by said lead fixing portion,
   each said bonding wire extending from said corresponding bonding pad, across the insulated side of said lead fixing portion to said lead contacting area on one of said plurality of leads; and
   a sealing resin covering and sealing said packaged IC chip, said bonding wires, said sheet-like coupling support member and said lead contact area on each of said leads.

2. An IC package according to claim 1, wherein part of each said bonding wire is fixed through a resin to said insulated side.

3. An IC package according to claim 2, wherein said resin for fixing said bonding wire is any one of a thermoplastic resin, a thermosetting resin, and an ultraviolet-curing resin each having a softening point lower than a wire bonding temperature.

4. An IC package according to claim 1, the sheet-like coupling member further comprising a metal wiring layer arranged on said insulated side of at least one of said chip fixing portion and said lead fixing portion.

5. An IC package according to claim 1, further comprising a metal heat spreader fixed on a surface different from said one major surface of said semiconductor chip.

6. An IC package according to claim 1 further comprising a hanging lead for supporting a package having a distal end adhered and fixed to sad insulating adhesive side of said sheet-like coupling support member.

* * * * *